United States Patent [19]

Goldberg

[11] Patent Number: 5,224,132
[45] Date of Patent: Jun. 29, 1993

[54] PROGRAMMABLE FRACTIONAL-N FREQUENCY SYNTHESIZER

[75] Inventor: Bar-Giora Goldberg, San Diego, Calif.

[73] Assignee: Sciteq Electronics, Inc., San Diego, Calif.

[21] Appl. No.: 823,286

[22] Filed: Jan. 17, 1992

[51] Int. Cl.$^5$ .............................................. H03K 5/00
[52] U.S. Cl. ....................................... 377/48; 377/47; 377/52; 331/1 A
[58] Field of Search ................... 377/48, 47, 52; 331/1 A

[56] References Cited

U.S. PATENT DOCUMENTS

| | | | |
|---|---|---|---|
| 3,882,403 | 5/1975 | Gerken | 328/14 |
| 3,928,813 | 12/1975 | Kingsford-Smith | 331/1 A |
| 3,935,538 | 1/1976 | Kizler et al. | 377/48 |
| 3,959,737 | 5/1976 | Tanis | 331/1 A |
| 3,967,945 | 8/1976 | Cox | 328/14 |
| 4,179,670 | 12/1979 | Kingsbury | 331/10 |
| 4,458,329 | 7/1984 | Remy | 364/851 |
| 4,468,632 | 8/1984 | Crowley | 331/14 |
| 4,492,936 | 1/1985 | Albarello et al. | 332/19 |
| 4,573,176 | 2/1986 | Yeager | 337/48 |
| 4,586,005 | 4/1986 | Crawford | 331/1 A |
| 4,686,488 | 8/1987 | Attenborough | 331/2 |
| 4,712,224 | 12/1987 | Nelson | 377/47 |
| 4,752,902 | 6/1988 | Goldberg | 364/721 |
| 4,763,083 | 8/1988 | Edwards | 331/2 |
| 4,815,018 | 3/1989 | Reinhardt et al. | 364/701 |
| 4,816,774 | 3/1989 | Martin | 331/1 A |
| 4,918,403 | 4/1990 | Martin | 331/1 A |
| 5,021,754 | 6/1991 | Shepherd et al. | 332/128 |
| 5,038,117 | 8/1991 | Miller | 331/16 |
| 5,038,120 | 8/1991 | Wheatley et al. | 332/128 |

Primary Examiner—William L. Sikes
Assistant Examiner—Scott A. Ouellette
Attorney, Agent, or Firm—Fulwider, Patton, Lee & Utecht

[57] ABSTRACT

A fractional divider using a counter means to provide fractionality. A divider is used to divide the VCO output signal by N or N+1 as selected. A divider control circuit controls the divider to divide by the appropriate divisor to obtain the selected output frequency. The fractional divider circuit counts divider control signals which represent a first division period. The fractional divider circuit establishes a second period of multiple first periods and at the terminal count of each second period, provides a selected number of fractional control signals to the divider control to cause division by a different number, such as N+1. The fractional divider comprises a first counter programmed to count first periods and issue its terminal count upon receiving the programmed count of first periods. The fractional divider also comprises a second counter to provide the selected number of fractional control signals upon receipt of the terminal count of the first counter. The first and second counters thus operate as a fraction, e.g. F/K, to result in a fractional reference frequency.

20 Claims, 3 Drawing Sheets

PROGRAMMABLE FRACTIONAL-N FREQUENCY SYNTHESIZER

BACKGROUND

The invention relates generally to frequency synthesis and more particularly, to fractional-N frequency synthesizers.

A frequency synthesizer generates an output signal having a frequency which has some relationship to a reference frequency, the accuracy of the output signal frequency typically being determined by the accuracy and stability of the source of the reference frequency. Frequency synthesizers utilizing a phase lock loop (PLL) to provide an output signal are well known in the art. Typically, a PLL includes a tunable oscillator, such as a voltage controlled oscillator (VCO), the output ($f_0$) of which is locked to the known reference signal ($f_r$) by means of a phase comparator. The phase comparator generates an output voltage or current that is proportional to the phase difference between the reference signal and the VCO output signal. The output of the phase comparator is coupled to the input of the VCO through a loop filter to tune and lock the VCO to a desired frequency.

To provide signals having different output frequencies, the PLL frequency synthesizer typically includes a controllable divider circuit interposed between the output of the VCO and the phase comparator. A processor receives the user's frequency selection and controls the divider circuit to divide the frequency of the VCO output signal by an appropriate number before providing the VCO output signal to the phase comparator. The frequency of the VCO output signal can thus be a multiple of the reference frequency. To obtain divisors which are greater than the value of the divider circuit, a divider period of multiple cycles is established over which the divisor value is averaged. While the divisor value is low in any particular cycle, when averaged over the entire period, the divisor value is correct. For example, where a divisor of 103 is required and the divider divides by the value of 10 or by 11, the processor of the synthesizer may command the divider to divide the VCO output frequency by ten for seven cycles of the period and by eleven for three cycles of the same period. Thus, when averaged over the entire period of ten cycles, the divisor of 103 is realized.

The output frequency $f_0$ of the VCO is thus related to the frequency $f_r$ of the reference frequency source by the relationship:

$$f_0 = N \cdot f_r$$

where N = the ratio desired between output and reference frequencies.

Typically, divider circuits divide only by integers and the smallest increment of change $\Delta$ in the VCO output frequency ($\Delta f_o$) is equal to the reference frequency itself ($f_r$). Therefore, the change in N ($\Delta N$) must be equal to or greater than one. This can result in a limitation on the frequency resolution of the synthesizer unless a very low reference frequency is used to achieve small increments of frequency change. However, a low reference frequency, or small step size, introduces undesirable effects such as a long settling time for the PLL and a higher noise level.

A technique known as fractional-N synthesis has been used to synthesize output signals at a frequency that is any arbitrary fraction of the reference signal frequency thereby permitting use of reference frequency sources having higher frequencies. Increments of frequency change in the output signal may be smaller than the frequency of the reference source.

In one technique, fractional division is simulated by changing the divisor value temporarily during the course of a second period which is longer than the first division period discussed above. Non-integer division ratios are realized by dividing by N+1, for example, instead of N, on a proportional number of division cycles of the second period to provide the desired divisor number when averaged over that second period. For example, if the desired divisor is N.1, the divide value will be N for nine division cycles and N+1 for one division cycle of the ten division cycles. Thus, when averaged over the entire second period of ten cycles, the divisor factor equals N.1 and the VCO output frequency will be N.1 times the reference frequency. To achieve this N+F/K divisor, the divider circuit will divide K-F cycles by N and F cycles by N+1, where K = the increase in periodicity and F > 0 but smaller than K. Applying this to the example of N.1 above, F = 1 and K = 10.

Applying this to the rational division example above, N would be 103. To obtain the divisor of 103.1, the divisor of 103 would be applied for nine cycles and the divisor of 104 would be applied for one cycle. When averaged over the entire ten cycles of the second period, the divisor of 103.1 results. Two periods exist in this example. The first is the basic division period of ten cycles in which the divisor averages 103. The second period is longer than the first and in this case, includes ten of the first periods. When averaged over this second period, the divisor averages 103.1.

A common method of achieving such fractional division in a fractional-N synthesizer is through the use of an accumulator. An example of such a prior art system is shown in FIG. 1. The synthesizer 10 of FIG. 1 includes a reference oscillator 12 which provides a reference frequency signal to a dual modulo counter 14. In this case, the dual modulo counter divides the frequency of the input signal by N or N+1 as selected. The divided signal is provided then to a programmable delay generator 16 which provides the output signal $F_o$. A digital divider 20 receives the output signal frequency selection from the user and determines the correct divisor to achieve the selected output frequency. This divisor is input to the modulo counter 14 over line 22. The digital divider 20 also inputs the incrementing value to the accumulator 26 over line 24. The accumulator 26 provides the value of its contents to the programmable delay generator 16. Output pulses from the programmable delay generator 16 increment the accumulator. At the time that the accumulator increments to its overflow, its carry signal is provided to the modulo counter 14 which then divides by N+1 instead of N.

The synthesizer 10 of FIG. 1 is directed to producing an output frequency which is less than the reference frequency 12. For example, in the case where the reference frequency $F_r$ is 10 Mhz and the desired output frequency $F_o$ is 3 Mhz, the digital divider 20 determines that one pulse should be produced by the synthesizer 10 for each 3.3333 pulses from the reference oscillator 12. The modulo counter 14 is thus set to selectably divide by three (N) and by four (N+1). The combination of dividing and delay results in an output frequency $F_o$ of 3 mhz. Such a synthesizer is disclosed in further detail in U.S. Pat. No. 3,976,945 to Cox.

One disadvantage of prior accumulator-based systems is the lack of flexibility. Once an accumulator has been installed and the overflow and increment values have been selected, it is relatively difficult to change these values. For example, once an accumulator has been installed which accumulates to sixteen before overflowing, it is difficult to change it to overflow at fifteen or at seventeen. Attempts to permit easier alteration of these values after installation of the accumulator typically include additional hardware devices to exert some control over the accumulator operation. The addition of such devices results in increased complexity, increased expense, larger size, and slower response times.

Some applications would benefit from a more easily programmable fractionality control technique; one which does not require additional hardware devices and control circuits to enable such programmability. For example, in some prior synthesizers, a multiplier is switched into the output circuit when the user selects a frequency residing in a higher range of frequencies. The multiplier not only increases the output frequency but also increases the step size by the multiplier value. In such synthesizers, the step size is maintained at the pre-multiplier step size by switching in an additional divider circuit at the time that the multiplier circuit is switched in. This approach adds complexity and additional hardware.

A fractionality control apparatus having the ability to change the step size or fraction simply by a processor command would be desirable. A fractional control apparatus which could as easily provide the fraction of 1/7 as it could provide 1/57 would enable much greater control over the frequency resolution of the output signal. If such an apparatus were available, the same fractionality control circuit could be used in synthesizers manufactured for different applications. The fractionality control apparatus could be programmed for the particular application prior to delivery, or at another time. Additionally, applications exist where widely varying fractions are desired and having a dynamic fractionality control apparatus which can select such fractions in response to processor control during synthesizer operation would satisfy such an application.

Hence, those concerned with providing fractional-N frequency synthesizers have recognized a need for a more flexible and versatile synthesizer, one which can provide greater flexibility in controlling fractionality without requiring complex fractionality circuits or hardware replacement. The present invention fulfills this need.

SUMMARY OF THE INVENTION

Briefly and in general terms, the present invention provides fractional-N dividing by using a counter means for controlling the fractionality. Fractional dividing in accordance with the invention comprises determining a second period by a counter means and providing a selected number of fractionality control signals over that second period by the counter means to obtain the fractional frequency selected. The second period of time exceeds the basic non-fractional division period of time. In an aspect of the invention, the counter means is programmable both as to the length of the second period in which fractionality control signals are provided and as to the number of fractionality control signals provided in that second period. The fractionality control signals cause the divider of the synthesizer to divide by a different number for the programmed number of cycles in the programmed length of the second period.

In another aspect in accordance with the invention, the fractionality counter means comprises two counters. A first or "F" counter provides its programmed number of count signals to the divider in the second period for causing division by a different divisor, such as N+1, for that number of count signals. A second or "K" counter determines the second period length by receiving and counting predetermined periodic synthesizer signals and upon reaching its terminal count, which defines the end of the second period, causes the F counter to preset and again provide its programmed number of count signals to the divider. Upon receiving the terminal count or preset signal from the K counter, the F counter once again provides its programmed number of count signals to the divider to cause division by N+1 for that number of counts and the K counter begins again to count signals to determine the end of the second period. Thus the combination of the F and K counters provides the fractionality of F/K.

Unlike an accumulator, the F and K counters in accordance with the invention are programmable. This provides greater versatility and flexibility in that a baseline fractional control circuit can be provided and installed in a wide variety of synthesizers. The K count can be selected and made non-programmable during manufacture of the synthesizer or the K counter can be configured as programmable so that the K count can be programmed into the K counter during synthesizer operation. The F counter is programmable during synthesizer operation to obtain the fractional frequency selected by the user. Thus a fractional counter means in accordance with the invention is easily programmable to obtain different output frequency step sizes and does not require the hardware changes or complex circuits required by prior accumulator approaches.

Other aspects and advantages of the invention will become apparent from the following detailed description and the accompanying drawings illustrating by way of example the features of the invention.

BRIEF DESCRIPTION OF THE DRAWINGS

FIG. 3A presents a timing diagram of the terminal count pulse of the divide-by-ten counter, FIG. 3B presents a timing diagram of the input to the adder device from the processor, FIG. 3C presents a timing diagram of the input to the adder device from the fractional counter means, and FIG. 3D presents a timing diagram of the output of the divide-by-eleven counter.

DETAILED DESCRIPTION OF THE PREFERRED EMBODIMENT

Figure 1:
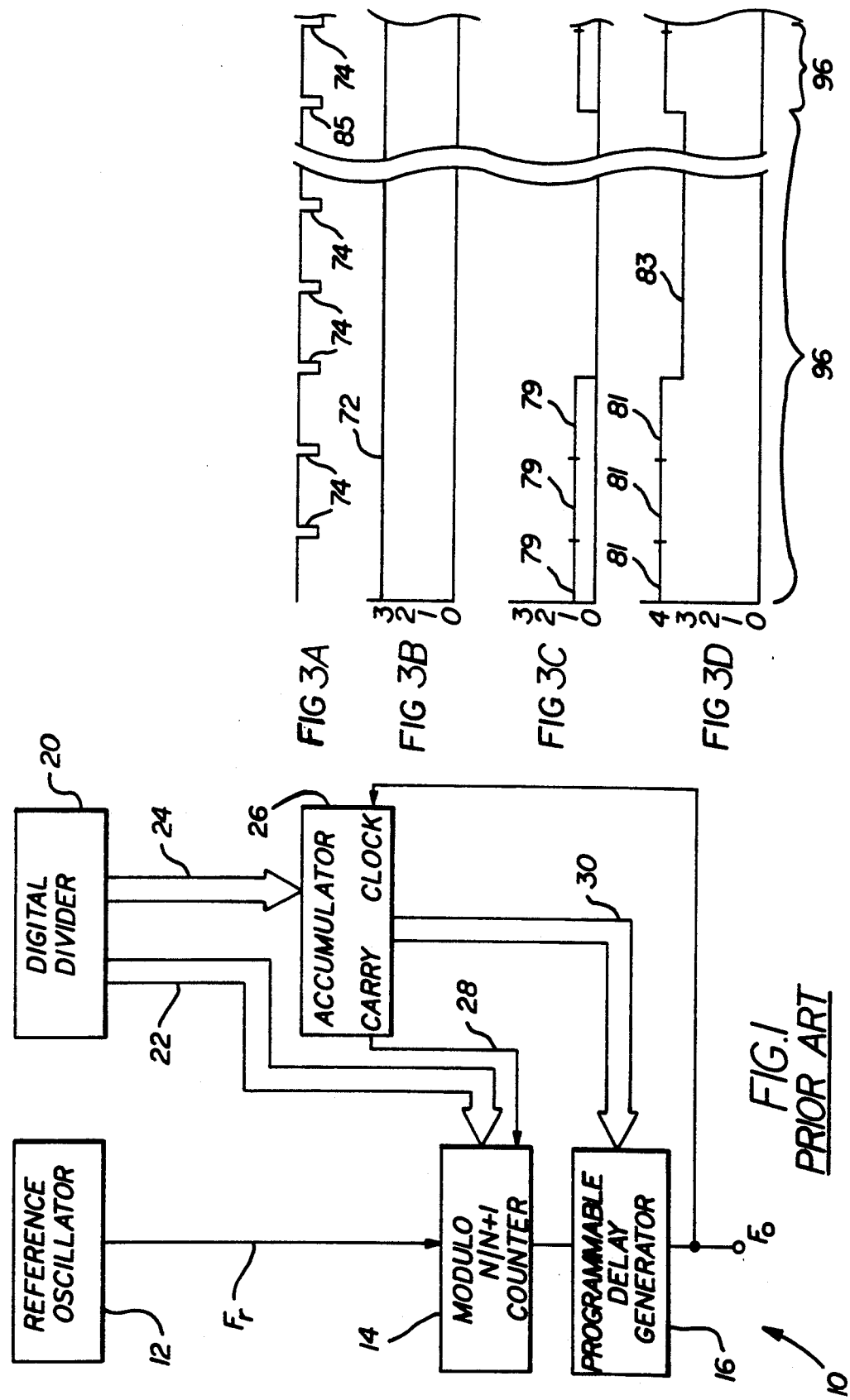
FIG. 1 is a block diagram view of a prior art fractional-N frequency synthesizer using an accumulator to provide fractionality.
Figure 2:
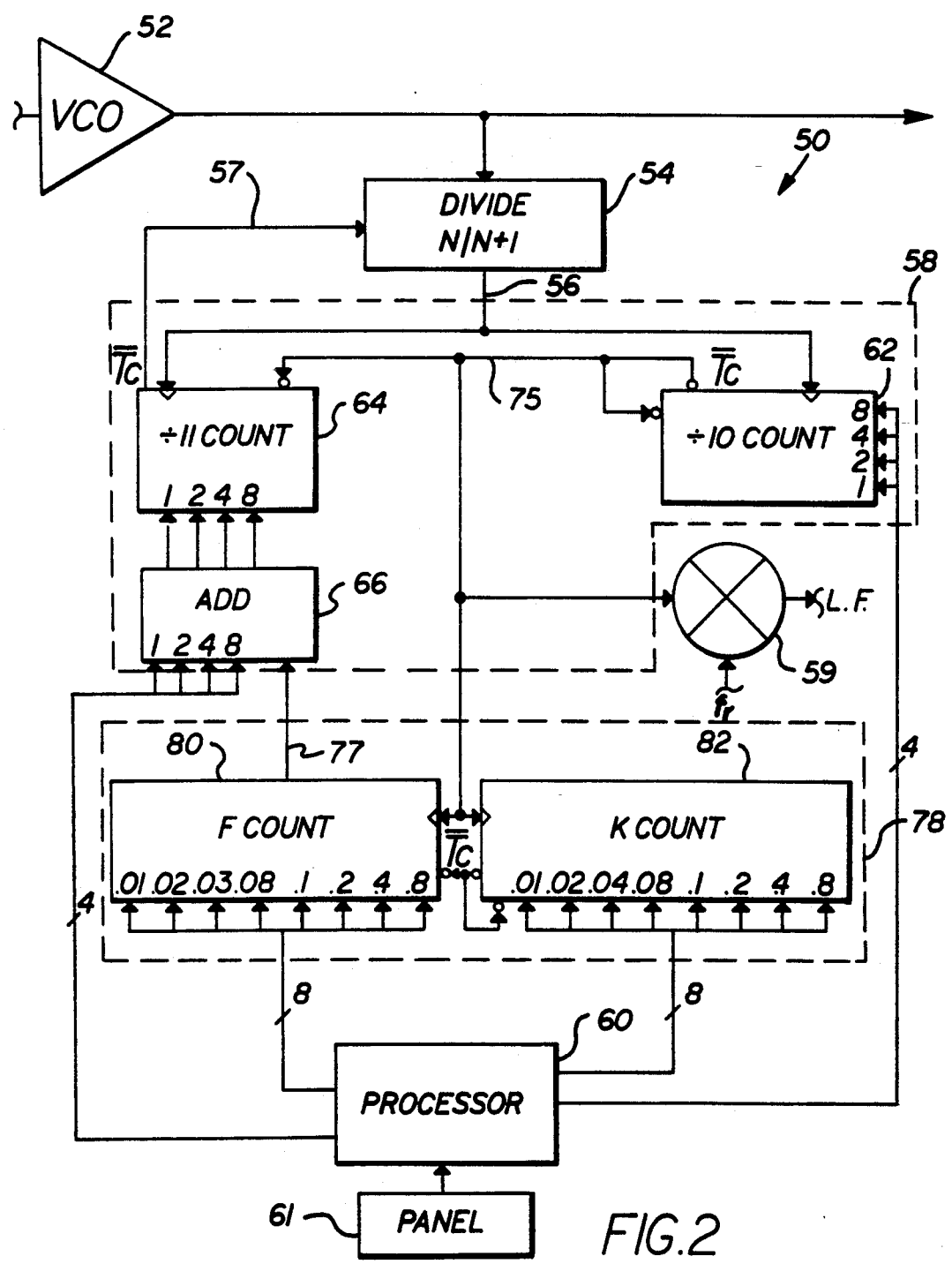
FIG. 2 is a block diagram of a programmable frequency synthesizer in accordance with the principles of the invention.

Referring now to the drawing with more particularity, wherein like reference numerals designate like or corresponding elements among the several views, there is shown in FIG. 2 a fractional-N control circuit 50 for use in a fractional-N frequency synthesizer. The output of the VCO 52 is received by a dual-modulo divider 54 which, in this example, selectably divides the frequency of the VCO signal by two divisors, N and N+1. In this case, a divide-by-ten/divide-by-eleven divider 54 is shown. Dividers having other divisors may be used; the divisors discussed herein and shown in FIG. 2 are selected for example purposes only.

The output 56 of the divider 54 is coupled to a divider controller 58 which issues control signals to the divider over line 57 to cause it to divide by either N or N+1 as programmed by the main processor 60. The main processor 60 programs the divider controller 58 in response to the selection of the output frequency from a panel 61 or by other means. In the embodiment of FIG. 2, the divider controller 58 comprises a divide-by-ten controller 62 and a divide-by-eleven controller 64 which are both programmed by the main processor 60 to respective counts. In an implementation of these controllers 62 and 64 as is discussed below in reference to FIG. 4, they are both counters. In the embodiment shown in FIG. 2, the divide-by-eleven controller 64 is controlled by the processor 60 through an adder device 66 as is discussed further below.

Both the divide-by-ten controller 62 and the divide-by-eleven controller 64 receive the output of the divider 54 on line 56 in their clock ports. In accordance with this embodiment, the divider 54 divides by ten (N) unless it receives a divide-by-eleven (N+1) command from the divide-by-eleven controller 64. Upon cessation of the divide-by-eleven command, the divider 54 reverts to dividing by ten until it receives the next divide-by-eleven signal. The divide-by-eleven controller 64 provides the number of divide-by-eleven command signals programmed into it by the main processor 60 to the divider 54. The divide-by-eleven controller 64 then waits to be preset by the divide-by-ten controller 62 at which time it will again output the number of divide-by-eleven command signals programmed into it.

The divide-by-ten controller 62 receives the output 56 from the divider 54, counts the pulses received on line 56 until it reaches its programmed terminal count at which time it issues its terminal count signal $\overline{T}_c$ to the preset inputs of both the divide-by-eleven controller 64 over line 75 and itself 62. This terminal count signal causes both the divide-by-eleven controller 64 and the divide-by-ten controller 62 to preset at which time the divide-by-eleven controller 64 provides its programmed number of divide-by-eleven command pulses to the divider 54 once again.

In the embodiment shown in FIG. 2, the terminal count signal from the divide-by-ten controller 62 is provided to the phase comparator 59 over line 75. The phase comparator also receives the reference frequency ($f_r$) and provides an output to the loop filter (L.F.).

A fractionality circuit 78 is provided for controlling the synthesizer to synthesize a frequency which is a fraction of the reference frequency. The fractionality circuit 78 in this embodiment comprises two counters labeled an "F" counter 80 and a "K" counter 82. The combination of the F and K counters in accordance with one aspect of the invention results in an F/K fraction of the reference frequency as is described below. The designations "F" and "K" are used herein only for convenience of description and are not meant to be limitations. Both the F and K counters receive the terminal count $\overline{T}_c$ signals from the divide-by-ten controller 62 over line 75 at their clock inputs. The F counter 80 is programmed by the main processor 60 in accordance with the output frequency selected by the user to provide a selected number of pulses to the adder device 66 over line 77 to achieve that output frequency. The adder device 66 receives the pulses from the F counter 80 and from the main processor 60, sums them and provides a summed count to the divide-by-eleven controller 64. By clocking the F and K counters from the $\overline{T}c$ signal of the divide-by-ten controller 62, a second period has been created which is longer than the basic division period by K times. The provision of divide-by-eleven pulses during the second period results in the fractionality.

After providing its programmed number of pulses to the adder device 66 over line 77, the F counter 80 waits until it is preset by the K counter 82 to once again provide its programmed number of pulses. The K counter 82 counts the terminal count pulses from the divide-by-ten controller 62 and upon reaching its own programmed number, provides its own terminal count pulse $\overline{T}_c$ to the preset inputs of both the F counter 80 and itself 82. Thus the K counter 82 operates as the denominator and the F counter 80 operates as the numerator of a fraction. The K counter 82 determines the ratio of F counter 80 pulses to the total number of terminal counts of the divide-by-ten controller 62 thus setting the fractionality.

For example, to achieve the fraction of 0.03, the F counter 80 would be programmed to provide three pulses to the adder 66 for every one hundred divide-by-ten controller 62 terminal counts. Thus, the K counter 82 would be programmed to provide its terminal count pulse only after receiving one hundred terminal count pulses from the divide-by-ten controller 62.

An example of the dual modulo divider operation in accordance with the above-discussed example is shown in the timing diagrams of FIG. 3 which reflect the example divisor of 103.03. FIG. 3A presents the terminal count 74 of the divide-by-ten controller 62. At each ten counts received from the divider 54, the divide-by-ten controller 62 outputs its terminal count 74 on line 75. Because the non-fractional divider of 103 is to be obtained in this example, the non-fractional division period 94 is ten pulses as was described in the Background section.

In FIG. 3B, the processor 60 input to the adder device 66 is shown. To obtain the three "elevens," the processor input is a count of three 72. Unless the non-fractional divisor is changed from 103 to some other number, the count input by the processor 60 will remain at three.

FIG. 3C presents the count provided to the adder device 66 by the F counter 80. To obtain a fraction of 0.03, three counts per each one hundred terminal counts $\overline{T}_c$ from the divide-by-ten controller 62 are provided to the adder device 66 on line 77 as was described above. Line 77 is a single line between the F counter 80 and the adder device 66; hence, three counts of one 79 are provided as shown in FIG. 3C.

FIG. 3D presents the output of the adder device 66 to the divide-by-eleven controller 64. The three counts from the processor 60 and the one count 79 from the F counter 80 have been added together to result in three counts of four 81 followed by ninety-seven counts of three 83 in the period of one hundred terminal counts $\overline{T}_c$ of the divide-by-ten controller 62. The timing lines of FIG. 3 have been broken for clarity of presentation but are meant to show a second period 96 of one hundred terminal counts 74 from the divide-by-ten controller 62. The fraction is thus 0.03.

At the one hundred and first terminal count 85 from the divide-by-ten controller 62, a new second period 96 is established. Another count of three "fours" followed by another count of ninety-seven "threes" are provided to the adder device 66.

The second period 96 of one hundred divide-by-ten controller 62 terminal counts 74 represents a true periodicity in the synthesizer. Each second period 96 is identical to the other second periods until the frequency of the synthesizer is changed. This not the case with the first period. Some first periods include division by eleven and some include division by ten. First periods will thus vary depending upon the particular divisor.

As is described above and shown in the figures, the output of a counter is a continuous string of pulses up to the count programmed. In an accumulator approach however, the pulses would be separated. The carry signal from the accumulator is only issued after the accumulator has accumulated the programmed number.

The count programming of the K counter 82 can be set at the factory or may be programmed by the processor 60 or by other means during use of the synthesizer as required. As shown in the example of FIG. 2, both the F counter 80 and K counter 82 have eight input lines which are used for count programming. All eight or fewer lines may be used for count programming as will be seen by reference to FIG. 4. Additionally, if greater resolution is required, the K counter 82 or both the F counter 80 and the K counter 82 may be replaced with counters having more input lines.

Processors which receive a user's output signal frequency selection and determine the correct number of cycles and divisor values to apply to achieve that selected output frequency are well known to those skilled in the art; therefore, no further technical detail is provided herein.

Figure 4:
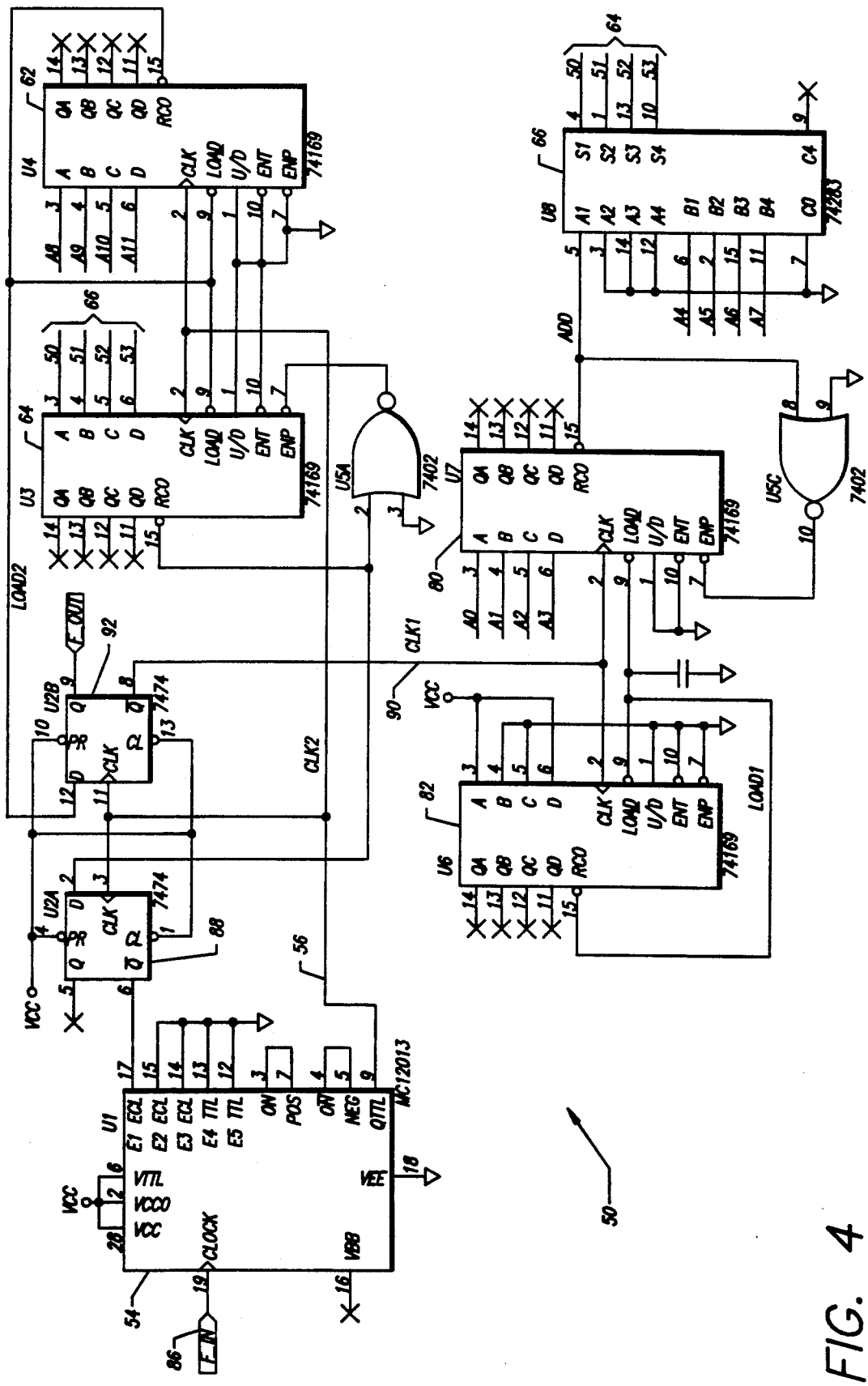
FIG. 4 is a schematic block diagram of an implementation of the circuit of FIG. 2.

Referring now to FIG. 4, a schematic block diagram is presented of an embodiment of a fractional-N control circuit 50 in accordance with the principles of the invention. The VCO output signal is received at port 86 and is provided to the dual modulo divider 54. As described above in relation to FIG. 2, this device 54 divides by ten unless commanded to divide by eleven by a signal received on its pin 17. The output 56 of the divider 54 is received at the clock ports (pin 2) of both the divide-by-eleven controller 64 and the divide-by-ten controller 62. The $\overline{T}_c$ output of the divide-by-eleven controller 64 is provided to the divider 54 at its pin 17 through the pins D (input) and $\overline{Q}$ (output) of the buffer 88 and causes the divider 54 to divide by eleven during its presence.

The terminal count pulse of the divide-by-ten controller 62 on port $\overline{T}_c$ is provided to the load or preset pins 9 of both the divide-by-eleven controller 64 and itself 62 and to the buffer 92 for provision on line 90 to the F and K counters 80 and 82 respectively at their clock inputs (pin 2). F counter 80 outputs its count to adder 66 and then awaits a preset signal from the K counter 82.

Although not shown in FIG. 4, the main processor communicates with the F counter 80 through pins 3 through 6, and 11 through 14 (eight lines). Adder 66 receives on its pin 5 the output from the F counter 80 and the main processor inputs on pins 2, 6, 11 and 15, adds these inputs and subsequently outputs from its pins 1, 4, 10 and 13 the added count to counter 64 to its pins 3 through 6.

K counter 82 receives programming inputs from the main processor (not shown) on pins 3 through 6 and outputs its terminal count signal $\overline{T}_c$ from pin 9. Pins 3 through 6 may be used for dynamic programming of the count although in the embodiment of FIG. 4, pins 3 and 6 (MSB and LSB) are hard-wired high to achieve the count of ten.

In the circuit of FIG. 4:
the modulo divider 54 is an 11C90 device, manufactured by National Semiconductor;
buffers 88 and 92 are common register devices; and
counters 62, 64, 80 and 82 and adder 66 are 74LS169 devices.

An expression applicable to the fractionality control circuit where the divider divides by ten and by eleven is the following:

$$D=(N-M+1)(10)+(M)(11)+F/(K+1)$$

where:
D = resulting divisor
N = divide by ten count
M = non-fractional divide by eleven count
F = F counter count
K = K counter count As an example, where the divisor of 103.03 is desired, a count of seven "10s" and three "11s" would be used to equal 103. Because the divide-by-ten controller issues its terminal count at "0" in the circuit of FIG. 4, N in the above formula would equal six if there were no divide-by-eleven pulses. Because the divide-by-ten controller counts continuously, the three divide-by-eleven pulses must be added to the six divide-by-ten pulses to equal a total of nine divide-by-ten controller counts. Thus N would equal nine. Because three "11's" are needed, M would equal three. Similarly to the calculation of N, the K counter counts to zero before its terminal count is issued; therefore, its count would be set to 99 to obtain hundredths in this fraction. F would equal three. The formula then becomes:

$$\begin{aligned} D &= (9 - 3 + 1)(10) + (3)(11) + 3/(99 + 1) \\ &= (6 + 1)(10) + 33 + .03 = 103.03 \end{aligned}$$

Thus, extreme flexibility is provided by a fractional control circuit in accordance with the principles of the invention. The use of counters as opposed to accumulators results in more versatility and flexibility. It is a relatively easy task to assign any fraction within the range of the F and K counters.

Although specific embodiments of the invention have been described and illustrated it is clear that the invention is susceptible to numerous modifications and embodiments within the ability of those skilled in the art, and without the exercise of the inventive faculty. Thus, it should be understood that various changes in form, detail and application of the present invention may be made without departing from the spirit and scope of the invention.

What is claimed is:

1. A fractional divider in a frequency synthesizer comprising:
a divider means for dividing a frequency by a plurality of selectable divisors and having a divider control means for providing, in a first period, divider control signals to the divider means for selecting the divisors;

a fractional counter means for providing a first counter which counts selected synthesizer signals to establish a second period having a selected number of counts wherein the second period is longer than the first period and which provides a second period terminal count signal representative of the end of the second period, and wherein said fractional counter means is responsive to the second period terminal count signal to provide a selected number of fractional control signals to the divider control means;

wherein the divider control means is responsive to both the divider control signals and to the fractional control signals to select divisors.

2. The fractional divider of claim 1 wherein the fractional counter means comprises a second counter which provides the selected number of fractional control signals to the divider control means in response to the second period terminal count signal.

3. The fractional divider of claim 1 wherein the divider means is responsive to each fractional control signal to divide by a predetermined divisor.

4. The fractional divider of claim 3 wherein the plurality of selectable divisors comprises N and N±1 and wherein the divider divides by N±1 in response to fractional control signals.

5. The fractional divider of claim 1 wherein:

the divider control means provides first period terminal count signals, each of which is representative of the end of a period; and wherein the first counter counts the first period terminal count signals from the divider control means and provides the second period terminal count signal upon counting the selected number of first period terminal count signals.

6. The fractional divider of claim 5 wherein the fractional counter means comprises a second counter which provides the selected number of fractional control signals to the divider control means in response to the second period terminal count signal.

7. The fractional divider of claim 6 wherein the divider control means counts signals from the divider means and upon reaching a selected number of divider signals, provides the first period terminal count signal.

8. The fractional divider of claim 7 wherein:

the divider control means comprises a third counter which counts said divider output signals and provides the first period terminal count signal;

the divider control means comprises a fourth counter which provides the selected number of divider control signals to the divider to cause the divider to divide by N+1 in response to each first period terminal count signal.

9. The fractional divider of claim 1 wherein the first counter is programmable for selecting the count to establish the second period.

10. The fractional divider of claim 1 wherein:

the fractional counter means comprises a second counter which provides the selected number of fractional control signals to the divider control means in response to the second period terminal count signal; and wherein the first counter is programmable for selecting the count to establish the second period and the second counter is programmable for selecting the number of fractional control signals provided in response to each second period terminal count signal.

11. A frequency synthesizer for synthesizing a desired output frequency, the synthesizer comprising:

a reference frequency source;

an output frequency source for providing an output frequency which is higher than the reference frequency;

divider means for dividing the output frequency by a plurality of selectable divisors;

divider control means for establishing a first period, for providing a first period terminal signal representative of the end of the first period, and for selecting divisors of the divider means;

fractional control means for providing a selected number of fractional control signals to the divider control means, the fractional control means comprising a first counter which counts the first period terminal signals to establish a second period comprising multiple first periods and which provides a second period terminal count signal representing the end of the second period, the fractional control means also comprising a second counter which provides the selected number of fractional control signals to the divider control means in response to each second period terminal count signal from the first counter; and the divider control means is responsive to the fractional control signals to select a predetermined divisor.

12. The frequency synthesizer of claim 11 wherein the plurality of selectable divisors comprises N and N±1 and wherein the divider divides by N±1 in response to fractional control signals.

13. The frequency synthesizer of claim 11 wherein the divider control means comprises a third counter which counts signals from the divider means and upon counting a selected number of divider signals, provides the first period terminal signal.

14. The frequency synthesizer of claim 13 wherein the divider control means comprises a fourth counter which provides the selected number of fractional control signals received from the fractional control means to the divider to cause the divider to divide by N±1.

15. The frequency synthesizer of claim 11 wherein the first counter is programmable for selecting the count to establish the second period and the second counter is programmable for selecting the number of fractional control signals provided in response to each second period terminal count signal.

16. A method for dividing an output frequency, the method comprising the steps of:

dividing the output frequency by a first divisor during a first period;

providing a first period terminal signal representative of the end of each first period;

counting said first period terminal signals with a first counter;

programming the first counter to provide a second period terminal count signal upon reaching a programmed count of said first period terminal count signals, said programmed count being greater than one;

receiving said second period terminal count signal by a second counter and said second counter providing a selected number of fractional control signals in response to the second period terminal count signal; and dividing the output frequency by a second divisor in response to the fractional control signals.

17. The method of claim 16 wherein the step of dividing the output frequency by a first divisor comprises dividing by N and the step of dividing the output frequency by a second divisor comprises dividing by N±1.

18. The method of claim 16 wherein:
the step of dividing the output frequency by a first divisor comprises the step of providing divided output signals; and
the step of providing a first period terminal signal representative of the end of each first period comprises the step of counting said divided output signals from the divider means and upon reaching a selected number of divider signals, providing the first period terminal signal.

19. The method of claim 16 further comprising the step of programming the second counter to provide a programmed number of fractional control signals in response to receiving a second period terminal count signal.

20. The method of claim 19 further comprising the step of:
selecting a desired divisor of the output frequency;
wherein the step of programming the first counter comprises selecting the programmed count of said first period terminal signals in response to the selection of the desired divisor; and
wherein the step of programming the second counter comprises selecting the programmed number of fractional control signals in response to the selected divisor.

* * * * *